United States Patent
McKee (10) Patent No.: US 7,468,532 B2
(45) Date of Patent: Dec. 23, 2008

(54) METHOD AND APPARATUS PROVIDING CAPACITOR ON AN ELECTRODE OF AN IMAGER PHOTOSENSOR

(75) Inventor: Jeffrey A. McKee, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 103 days.

(21) Appl. No.: 11/178,803

(22) Filed: Jul. 12, 2005

(65) Prior Publication Data

US 2007/0012964 A1 Jan. 18, 2007

(51) Int. Cl.
*H01L 31/113* (2006.01)
(52) U.S. Cl. .................. 257/292; 257/234; 257/236; 257/238; 257/239; 257/291
(58) Field of Classification Search ................ 257/239, 257/249, 250, 291, 292, 296, 300, E27.132, 257/E27.133, 234, 236, 238; 348/294, 302, 348/308
See application file for complete search history.

(56) References Cited

U.S. PATENT DOCUMENTS

| | | | |
|---|---|---|---|
| 4,388,532 A * | 6/1983 | Garcia | 250/208.1 |
| 5,955,753 A | 9/1999 | Takahashi | |
| 5,962,844 A * | 10/1999 | Merrill et al. | 250/214 A |
| 6,107,655 A | 8/2000 | Guidash | |
| 6,160,281 A | 12/2000 | Guidash | |
| 6,198,086 B1 | 3/2001 | Schanz et al. | |
| 6,204,524 B1 * | 3/2001 | Rhodes | 257/222 |
| 6,218,656 B1 | 4/2001 | Guidash | |
| 6,352,869 B1 | 3/2002 | Guidash | |
| 6,423,994 B1 | 7/2002 | Guidash | |
| 6,552,323 B2 | 4/2003 | Guidash et al. | |
| 6,587,146 B1 * | 7/2003 | Guidash | 348/308 |
| 6,624,850 B1 * | 9/2003 | Guidash | 348/308 |
| 6,657,665 B1 | 12/2003 | Guidash | |
| 6,947,088 B2 | 9/2005 | Kochi | |
| 2004/0251394 A1 * | 12/2004 | Rhodes et al. | 250/208.1 |
| 2005/0167574 A1 | 8/2005 | He | |

FOREIGN PATENT DOCUMENTS

TW 567716 12/2003

* cited by examiner

*Primary Examiner*—Ngan V Ngo
*Assistant Examiner*—Benjamin Tzu-Hung Liu
(74) *Attorney, Agent, or Firm*—Dickstein Shapiro LLP (57) ABSTRACT

An imaging device having a pixel array in which one plate of a storage capacitor is coupled to a storage node while another plate is formed by an electrode of a photo-conversion region.

54 Claims, 10 Drawing Sheets

METHOD AND APPARATUS PROVIDING CAPACITOR ON AN ELECTRODE OF AN IMAGER PHOTOSENSOR

The invention relates generally to semiconductor imaging devices and in particular to an imager having an array of pixel cells and circuitry for the cells which includes a capacitor.

BACKGROUND OF THE INVENTION

Figure 1:
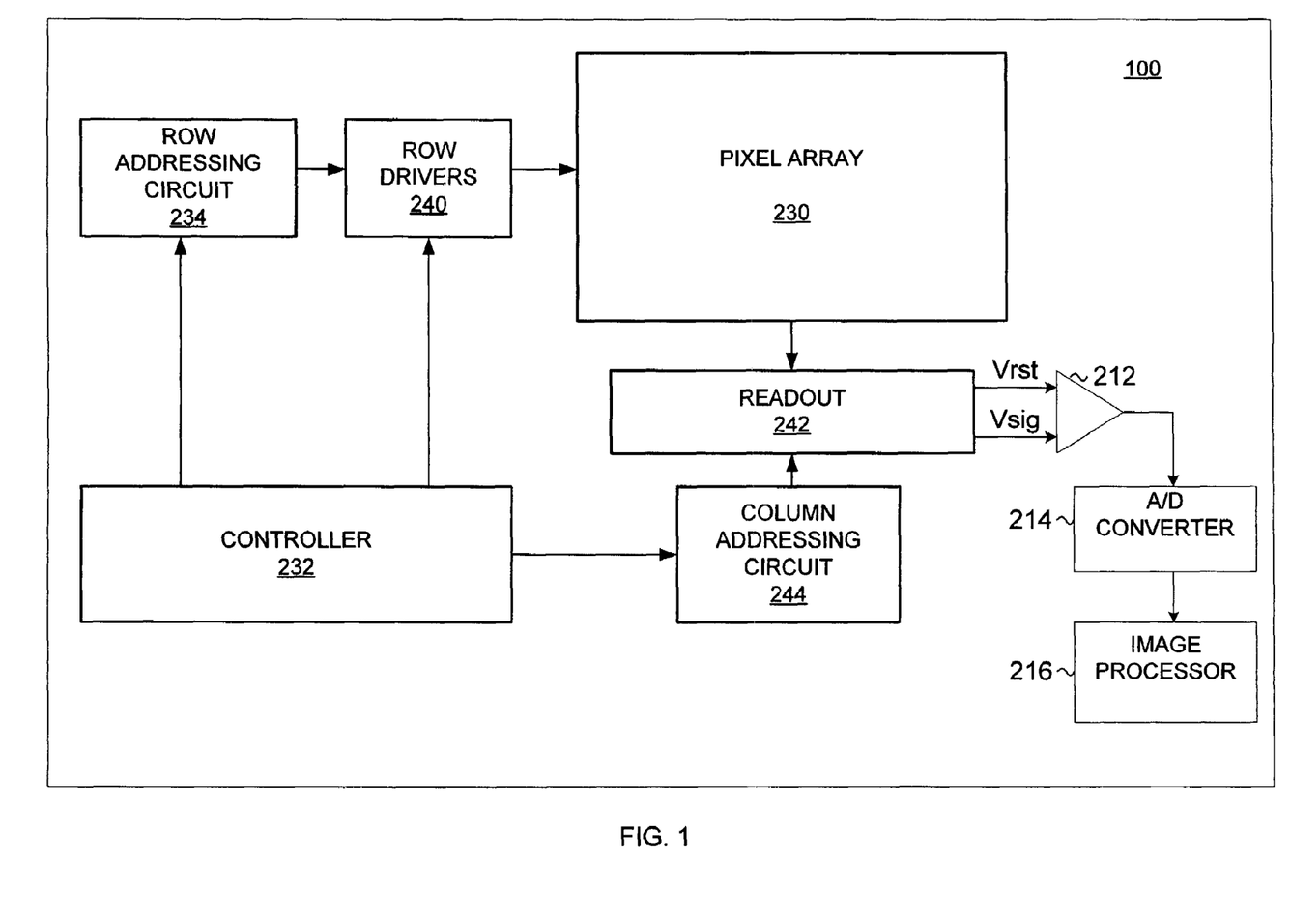
FIG. 1 is a block diagram of a conventional APS system.

There is a current interest in CMOS active pixel imagers for use as low cost imaging devices. FIG. 1 shows an imager 100 that includes a CMOS active pixel sensor ("APS") pixel array 230 and a controller 232 that provides timing and control signals to enable the reading out of signals stored in the pixels in a manner commonly known to those skilled in the art. Exemplary arrays have dimensions of M×N pixels, with the size of the array 230 depending on a particular application. The imager pixels are readout a row at a time using a column parallel readout architecture. The controller 232 selects a particular row of pixels in the array 230 by controlling the operation of row addressing circuit 234 and row drivers 240. Charge signals stored in the selected row of pixels are provided on column lines to a readout circuit 242. The pixel signals read from pixels in each of the columns, typically a reset signal Vrst and an image signal Vsig for each pixel, are then readout sequentially using a column addressing circuit 244 and supplied to a differential amplifier 212 where the difference signal Vrst−Vsig, representing the light seen by a pixel, is digital converted in A-to-D converter 214 and provided to image processor 216.

Figure 2:
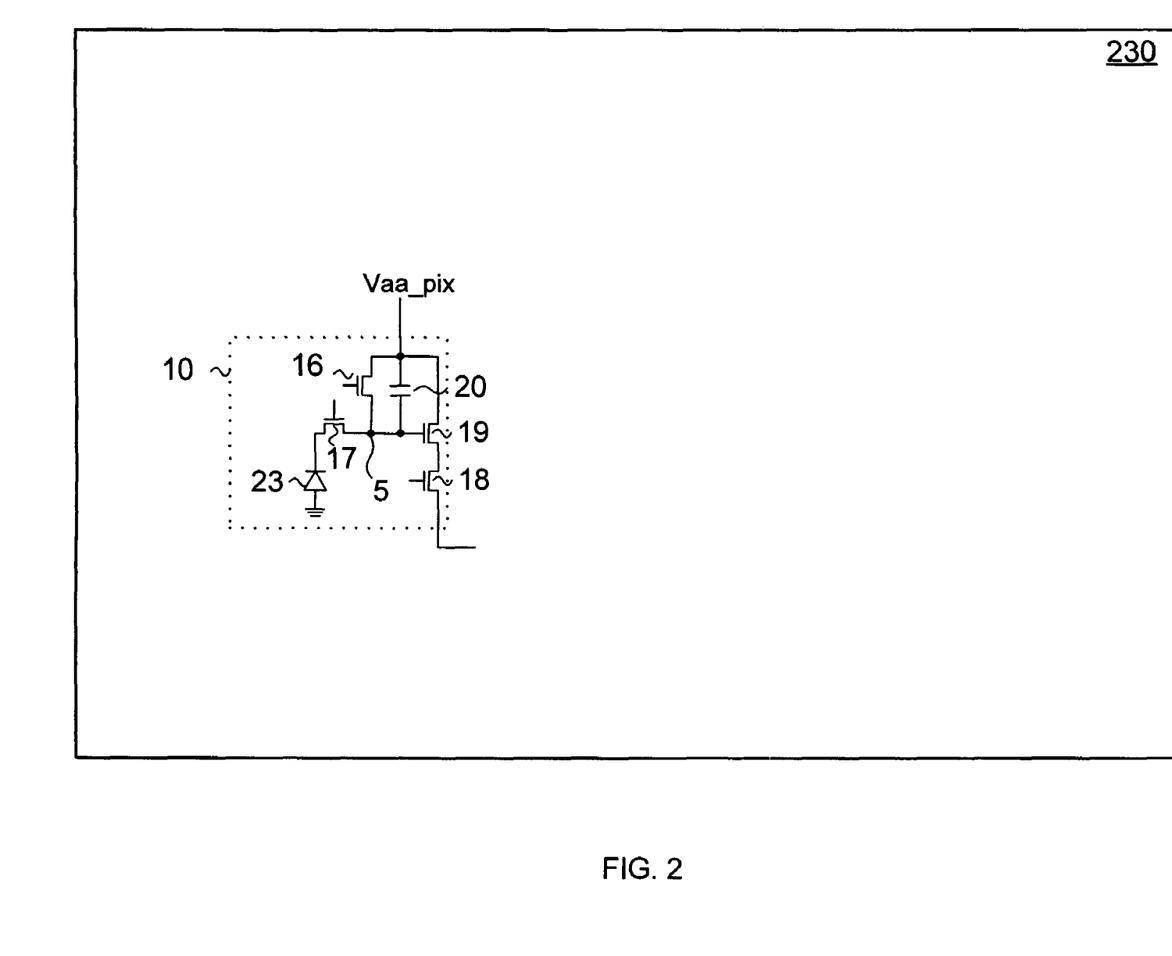
FIG. 2 is a schematic diagram of a representative pixel which may be used in a conventional pixel array of FIG. 1.

FIG. 2 shows a portion of the pixel array 230 of FIG. 1 in greater detail. FIG. 2 illustrates an exemplary four transistor (4T) CMOS pixel 10 in the pixel array 230. The CMOS pixel 10 generally comprises a photo-conversion device 23 for generating and collecting charge generated by light incident on the pixel 10, and a transfer transistor 17 for transferring photoelectric charges from the photo-conversion device 23 to a sensing node, typically a floating diffusion region 5. The floating diffusion region 5 is electrically connected to the gate of an output source follower transistor 19. The pixel 10 also includes a reset transistor 16 for resetting the floating diffusion region 5 to a predetermined voltage (shown as the array pixel supply voltage Vaa_pix); and a row select transistor 18 for outputting a signal from the source follower transistor 19 to an output column line in response to an address signal. In this exemplary pixel 10, a capacitor 20 is also included. One plate of the capacitor 20 is coupled to Vaa_pix cell and the other plate of the capacitor 20 is coupled to the floating diffusion region 5. The capacitor 20 need not be present but does have the benefit of, when used, increasing the charge storing capacity of the floating diffusion node 5. In addition, the capacitor may be connected in series with a transistor switch to selectively control connection of the capacitor to the floating diffusion node 5.

Figure 3:
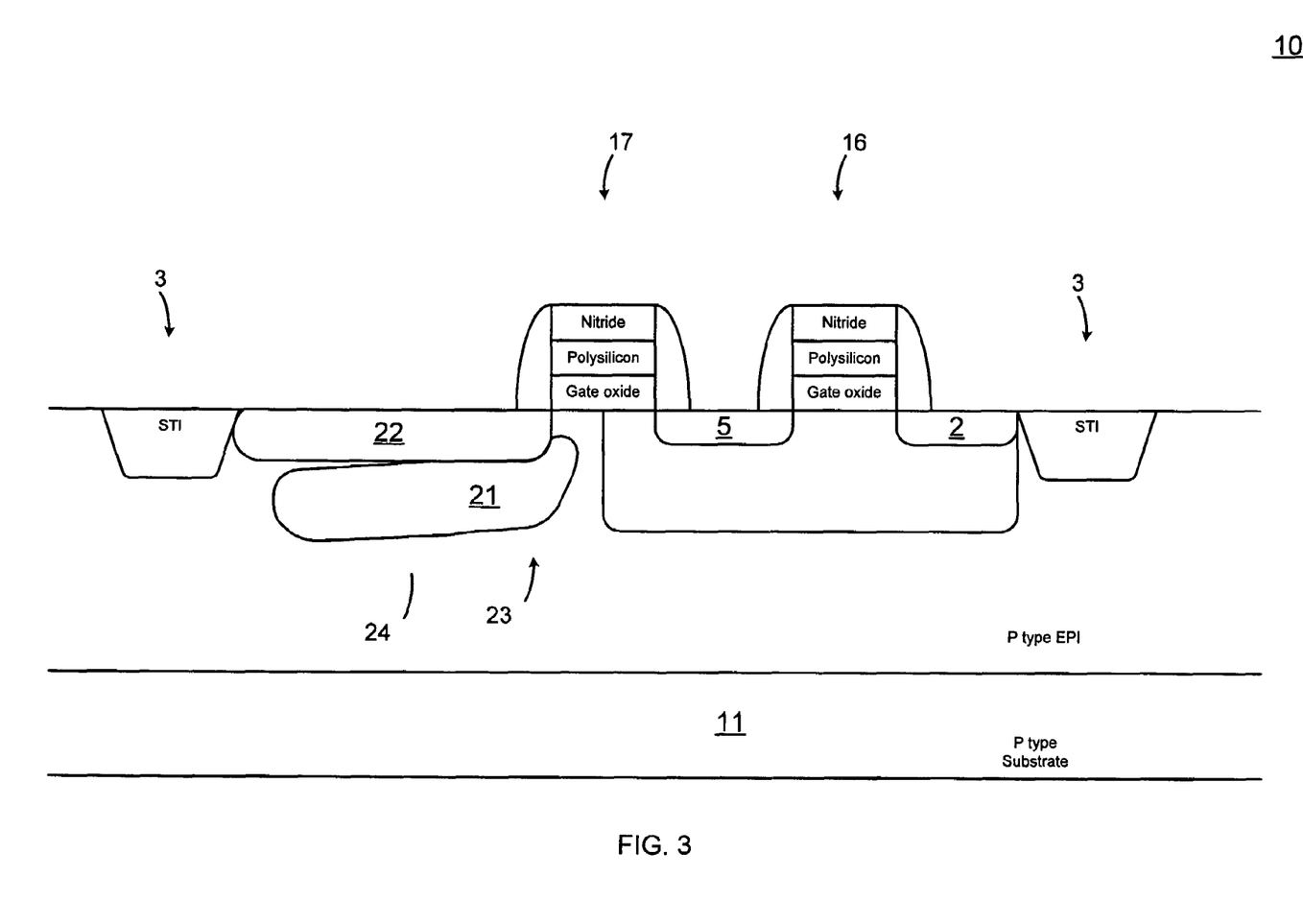
FIG. 3 is a cross-sectional view of a portion of the conventional pixel of FIG. 2.

FIG. 3 is a cross-sectional view of a portion of the pixel 10 of FIG. 2 showing the photo-conversion device 23, transfer transistor 17 and reset transistor 16. The exemplary CMOS pixel 10 has a photo-conversion device 23 that may be formed as a pinned photodiode. The photodiode photo-conversion device 23 has a p-n-p construction comprising a p-type surface layer 22 and an n-type accumulation region 21 within a p-type epitaxial active layer 24 formed on a p-type substrate 11. The photodiode 23 is adjacent to and partially underneath the transfer transistor 17. The reset transistor 16 is on a side of the transfer transistor 17 opposite the photodiode 23. As shown in FIG. 3, the reset transistor 16 includes a source/drain region 2 which is coupled to the supply voltage Vaa_pix. The floating diffusion region 5 is between the transfer and reset transistors 17, 16 and is electrically coupled to the gate of the source follower transistor 19 (FIG. 2) and to one plate of the capacitor 20, if the latter is used.

In the exemplary CMOS pixel 10 depicted in FIGS. 2-3, electrons are generated by light incident on the photo-conversion device 23 and are stored in the n-type photodiode region 21. These charges are transferred to the floating diffusion region 5 by the transfer transistor 17 when the transfer transistor 17 is activated. The source follower transistor 19 produces an output signal based on the transferred charges. A maximum output signal is proportional to the number of electrons extracted from the n-type photodiode region 21.

Conventionally, a shallow trench isolation (STI) region 3 is used to isolate the pixel 10 from other pixels and devices of the image sensor. The STI region 3 is typically formed using a conventional STI process. The STI region 3 is typically lined with an oxide liner and filled with a dielectric material. Also, the STI region 3 can include a nitride liner which provides several benefits, including improved corner rounding near the STI region 3 corners, reduced stress adjacent the STI region 3, and reduced leakage for the transfer transistor 17.

It is desirable to increase the fill factor and charge storage capacity of an array 230 (FIG. 1). However, the inclusion of a capacitor 20, used to increase charge storage capacity, requires space in the array 230. There is a tradeoff of space: the greater space consumed by capacitors in an array the less available for the photo-conversion devices 23. As such, including capacitors in the array 230 effects the fill factor of the array 230. Therefore, it is desirable to include capacitors to increase charge storage capacity without significantly effecting the fill factor of the array 230.

BRIEF SUMMARY OF THE INVENTION

In one aspect of the invention as depicted in an exemplary embodiments capacitors are provided in a pixel array employing photogates as photosensors in a manner that does not significantly reduce the fill factor of the array. A first plate of a capacitor operative for a pixel is also part of the photogate, while a second plate is coupled to a charge storage region.

In another aspect of the invention, the second capacitor plate coupled to a charge storage region for a pixel in one row is also part of the of the photogate electrode of a different pixel in a different row.

In another aspect of the invention, the second plate of the capacitor may also be employed in a switched arrangement such that it is selectively connected to the charge storage node.

BRIEF DESCRIPTION OF THE DRAWINGS

These and other features and advantages of the invention will be more readily understood from the following detailed description of the invention which is provided in connection with the accompanying drawings, in which.

DETAILED DESCRIPTION OF THE INVENTION

In the following detailed description, reference is made to the accompanying drawings, which form a part hereof, and in which is shown by way of illustration specific exemplary embodiments of the invention. These embodiments are described in sufficient detail to enable those of ordinary skill in the art to make and use the invention, and it is to be understood that structural, logical or other changes may be made to the specific embodiments disclosed without departing from the spirit and scope of the present invention.

Figure 4:
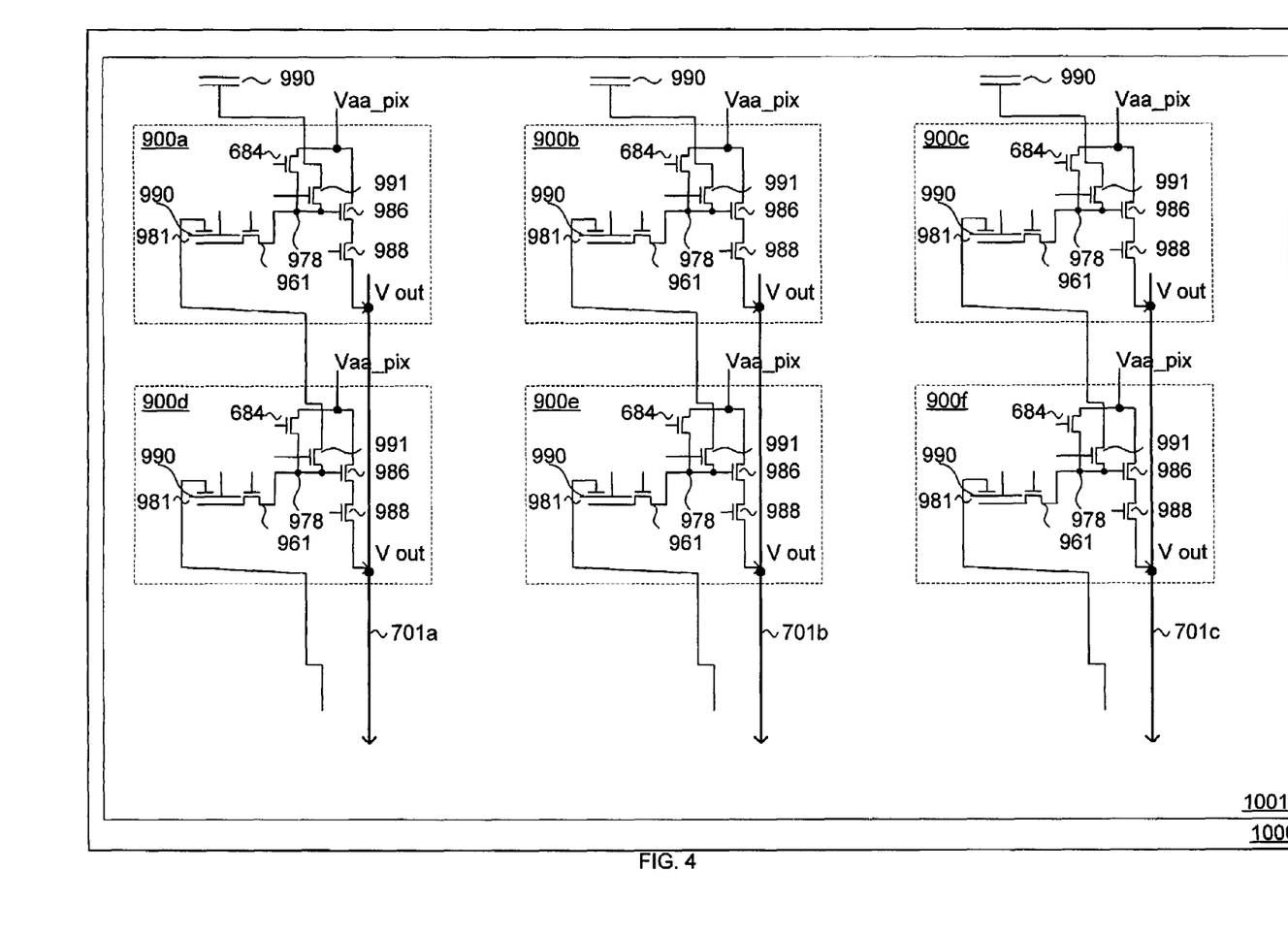
FIG. 4 is a schematic diagram of a pixel array of an imaging device in accordance with an exemplary embodiment of the invention.

FIG. 4 shows an electrical schematic of imaging device 1000, having a pixel array 1001 which includes a plurality of pixels in accordance with an exemplary embodiment of the invention. Pixel circuit 900d is part of pixel array 1001 and is representative of other pixels in the array. The pixel circuit 900d includes photogate 981, transistor 991, which may be operated to provide pixel 900d with a dual conversion gain (DCG) as described below, a storage node formed as a floating diffusion region 978, transfer transistor 961, reset transistor 684 and readout circuitry which includes source follower transistor 986 and row select transistor 988. The electrode of the photogate 981 in a pixel one row above, here peel 900a, also serves as one plate of a capacitor 990 used by pixel 900d. The other plate of capacitor 990 for pixel 900d is coupled to a floating diffusion region 978 through transistor 991. In each pixel, e.g., 900d, the capacitor 990 is switchably coupled to the floating diffusion region 978 of the pixel by transistor 991.

By capacitor 990 having one plate shared with the photogate of a pixel, the capacitor 990 can be easily fabricated over a portion of the photogate 981. Thereby conserving layout space in the pixel array of 1001. As such, the pixel array 1001 can take advantage of the benefits that accompany the inclusion of pixel capacitors into the pixel array 1001 without significantly affecting the fill factor.

Transistor switch 991 may be turned on one or more times during a charge transfer from photogate 981 through transfer transistor 901 to a respective floating diffusion region 978. If transistor 991 is turned on to couple capacitor 990 to the floating diffusion region 978 during a single charge transfer event the pixels operate with a single conversion gain. In such an arrangement each pixel outputs a reset signal Vrst, based on charges at the floating diffusion region 978 following a reset operation and an image signal Vsig based on charges in the floating diffusion region 978 after charge is transferred from the photogate 981 through transfer transistor 961. On the other hand each pixel may also be operated in a manner where the transistor 991 is off during a first transfer of charge from a photo gate 981 to the floating diffusion region 978 and thereafter turned on for a second transfer of charge from the photogate 981 to the floating diffusion region 978. This operation provides a pixel with a dual conversion gain (DCG). In this case each pixel outputs a reset signal Vrst, a first image signal Vsig taken based on transferred charged before the capacitor 990 is coupled to the floating diffusion region and a second image signal Vdcg taken after the capacitor 990 is connected to the floating diffusion region 978 followed by second charge transfer.

Figure 5:
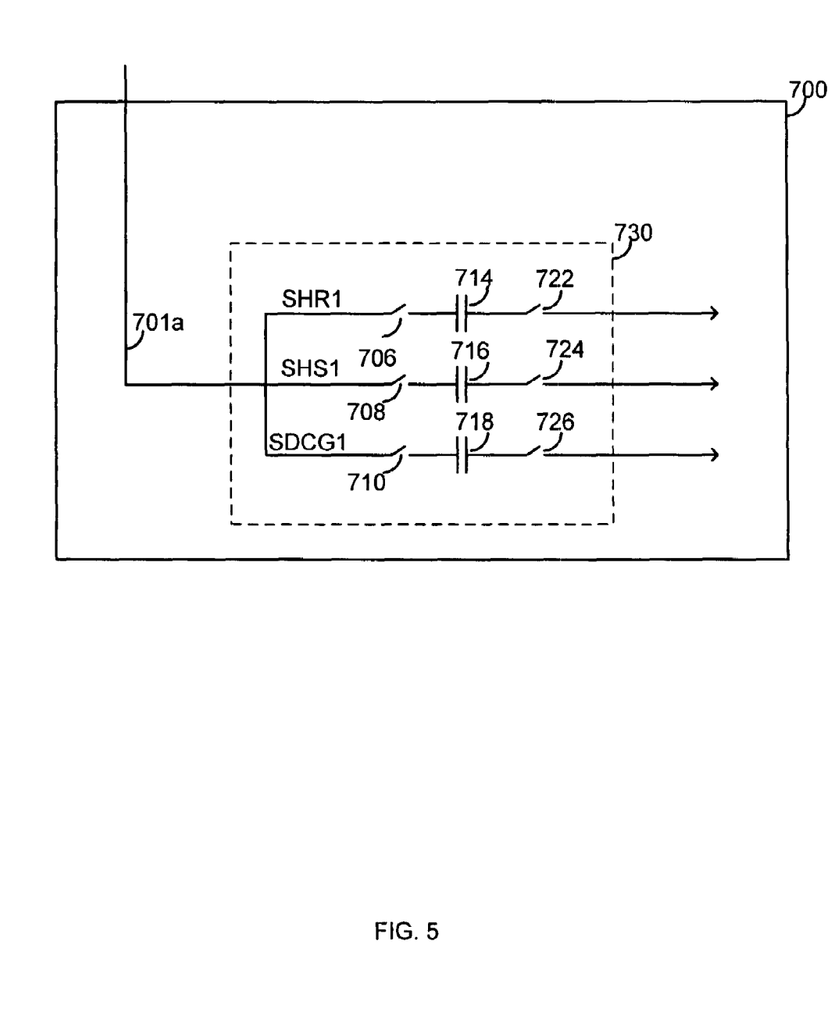
FIG. 5 is a schematic diagram of a sample and hold circuit.

Pixel circuits in a pixel column share a readout column line 701, e.g. 701a, 701b, and are coupled to a respective column shared sample and hold circuit 700 (FIG. 5) which is part of the column read out circuitry. The column sample and hold circuit of FIG. 5 is arranged to receive the three signals Vrst, Vsig, Vdcg from each pixel as part of a pixel readout process when the DCG operation is employed. The three signals are respectively switched to capacitors 714, 716, and 718 as described below. In an exemplary embodiment, signals are read from the pixel array 1001 (FIG. 4) pixel row by pixel row starting with the top pixel row and proceeding incrementally to the bottom pixel row. For example, pixels 900a, 900b, and 900c would be readout at substantially the same time. Then pixels 900d, 900e, and 900f would be readout at substantially the same time. The row by row readout of the pixel array continues until the last row of the array is read. When only a single conversion gain is employed for each pixel, elements 710, 718 and 726 can be omitted from sample and hold circuit 700.

If the dual conversion gain mode is used, transistor 991 is activated at part of the charge transfer process for transferring charge from the photogate 981 to the floating diffusion region 978. Charge transfer under control of the transfer transistor 961 occurs in two steps as noted and the three signals, Vrst, Vsig and Vdcg, are readout from each pixel and respectively stored on capacitors 714, 715, and 718 in sample and hold circuit 700 under control of respective sample and hold signals SHR1, SHS1, and SDCG1 which respectively operate switches 706, 708 and 710. For single conversion gain operation only capacitors 714 and 716 are employed under respective control of signals SHR1 and SHS1 to store the Vrst and Vsig pixel outputs.

As noted, FIG. 5 is a schematic diagram of a portion of a sample and hold circuit 700 in accordance with an exemplary embodiment of the invention. Although only one sample and hold circuit 700 is depicted, sample and hold circuit 700 is representative of a sample and hold circuit 700 for each column of pixel circuits in the pixel array.

Figure 6:
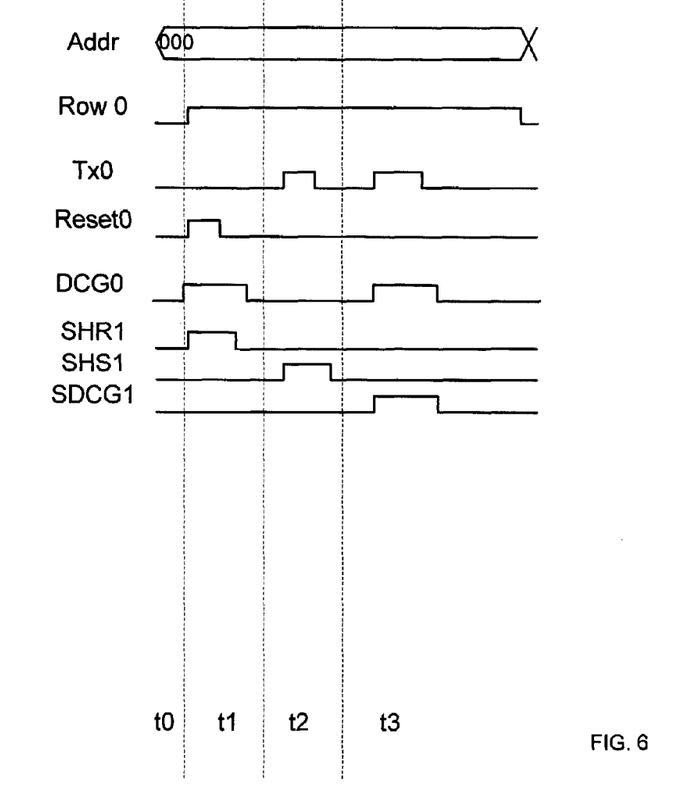
FIG. 6 is a timing diagram depicting the partial operation of the circuit of FIGS. 4 and 5.

FIG. 6 is a timing diagram depicting operation of the pixel array 1001 of FIG. 4 using sample and hold circuit (FIG. 5) using dual conversion gain circuit in accordance with an exemplary embodiment of the invention, although other ways of operating the pixel array are possible. For simplicity, the readout of a pixel in a row is discussed and is representational of the other pixels in the array. Readout from the pixel array 1001 is performed in a manner similar to the conventional readout from an imager having 4T pixels. In the timing diagram of FIG. 5, the signals are active "high," i.e., high logic state. A "Row" is a row of pixels, e.g., 900a, 900b, 900c. (FIG. 4). The first row of pixels is Row 0, e.g., 900a, 900b, 900c. (FIG. 4); the second row of pixels is Row 1, e.g., 900d, 900e, 900f. (FIG. 4).

In FIG. 6, Addr is the row address of the row being readout. ROW 0 is representational of the row select gate signal for row 0. TX0 is representational of the transfer gate signal for row 0. Reset0 is representational of the reset gate signal for row 0. DCG0 is representational of the DCG gate control signal for row 0. SHR1, SHS1, and DCG1 are the signals that enable the switches to couple capacitors 714, 716, and 718, respectively, (FIG. 5) to the column line 701a.

In FIG. 6, time period t0 indicates the initial setup time period during which the row address of the pixels cells to be readout is provided. In this example during t0, an Addr of 000 is provided which corresponds to the first row (i.e., row 0).

Although the example describes the readout from one pixel, e.g., pixel 900*a* (FIG. 4), this example is representational of all of pixels in a row being readout at substantially the same time as is conventionally known.

During time period t1, pixel circuit 900*a* is reset and the reset charge is stored as follows. Control signals Reset0, Row0, DCG0, and SHR1 are enabled (i.e., asserted high) (FIG. 6). The Row0 signal closes switch 988 and couples pixel 900*a* to a column line 701*a* (FIG. 6). The Reset0 signal closes switch 984 and couples Vaa_pix to the pixel 900*a* (FIG. 6). The DCG0 signal closes switch 991 and couples the floating diffusion region 978 to a capacitor 990 of a pixel 900*x* (where pixel 900*x*, not shown, is the pixel one row above pixel 900*a*). The SHR1 signal closes a switch and couples capacitor 714 to pixel 900*a* through column line 701*a*. Thus at the end of time period t1, pixel 900*a*, including capacitor 990, is reset and the reset voltage Vrst of the pixel 900*a* is stored in a sample and hold circuit (FIG. 5). Control signals Reset0, DCG0, and SHR1 are disabled (i.e., driven low) by the end of time t1.

During time period t2, the integration charge (i.e., photo signal) of the pixel circuit 900*a* accumulated at that time is readout and stored as follows. Control signals Tx0 and SHS1 are enabled (i.e., driven high) while the row select signal Row) is still enabled and transistor 991 is off. The Tx0 signal closes switch 961 and couples photo-conversion device 981 to the floating diffusion region 978. The SHS1 signal closes switch in the sample hold circuit and couples capacitor 716 (FIG. 5) to pixel 900*a* through column line 701*a*. The charge stored on floating diffusion region 978 is read out as image signal Vsig and stored on the capacitor 716. Thus at the end of t2, the signal voltage Vsig of the pixel 900*a* is stored in the sample and hold circuit. Control signals Tx0 and SHS1 are disabled (i.e., driven low) by the end of time period t2 (FIG. 6).

During time period t3, a second charge transfer occurs as follows. Control signals Tx0, DCG0, and SDCG1 are enabled (i.e., driven high). The Tx0 signal closes switch 961 and couples photo-conversion device 981 to the floating diffusion region 978. The DCG0 signal closes switch 991 and couples capacitor 990 to the photo-conversion device 981 and the floating diffusion region 978. The SDCG1 signal closes switch 710 in the sample hold circuit and couples capacitor 718 (FIG. 5) to pixel 900*a* through column line 701*a*. The charge stored on floating diffusion region 978 is read out and stored on the capacitor 718. Thus at the end of t3, the signal voltage Vdcg of the pixel 900*a* is stored in the sample and hold circuit. Control signals Tx0, DCG0, and SDCG1 are disabled (i.e., driven low) by the end of time period t3 (FIG. 6).

Figure 7:
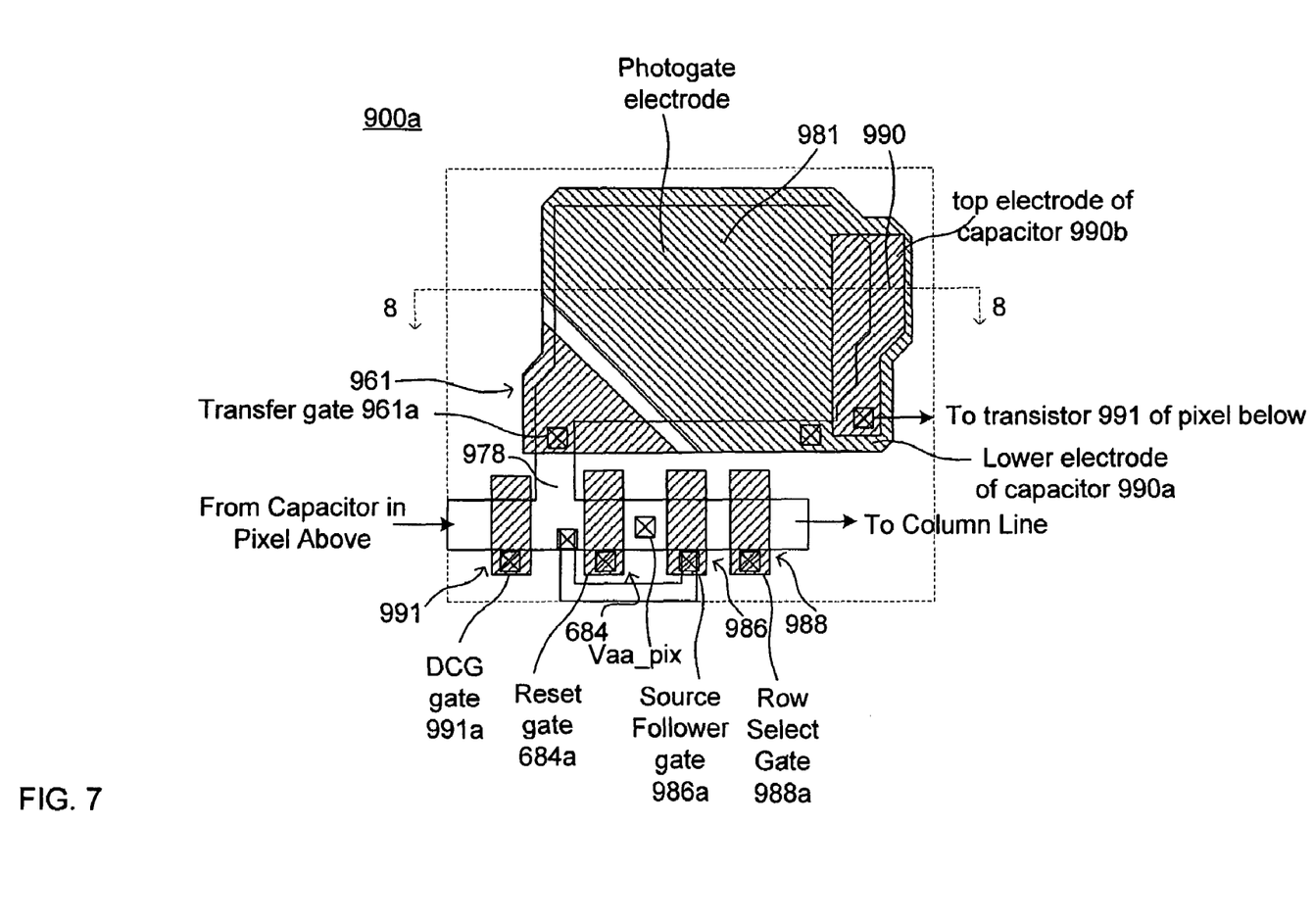
FIG. 7 is a plan view of the layout of the device of FIG. 4.

There exist various ways to operate and use the DCG gate 991 and capacitor 990. One way, as described above with reference to FIG. 6, samples and holds a dual conversion gain signal. In another approach, the DCG gate 991 is on during a single transfer of charge from photogate 981 to the floating diffusion region 978 providing only a single conversion gain for a pixel FIG. 7 shows a top down layout view of one pixel of the pixel array 1001 of FIG. 4. As depicted in the pixel 900*a* which is representational of the remaining pixels of the array, a capacitor 990 is disposed over and one plate thereof is formed by a part of the electrode of photogate 981. The pixel 900*a* also includes transfer transistor 961 having a transistor gate 961*a*, a reset transistor 984 having a reset gate 984*a*, a dual conversion gain (DCG) transistor 991 having a gate 991*a*, and readout circuitry, i.e., source follower transistor 986 having a gate 986*a*, row select transistor 988 having a gate 988*a*, and floating diffusion region 978. Each capacitor 990 has the lower plate 990*a* as part of the electrode of photogate 981 and an upper plate 990*b* coupled to DCG transistor 991 which selectively connects the upper plate to the floating diffusion region 978 of a pixel 900*d* in the row below the pixel 900*a*.

Figure 8:
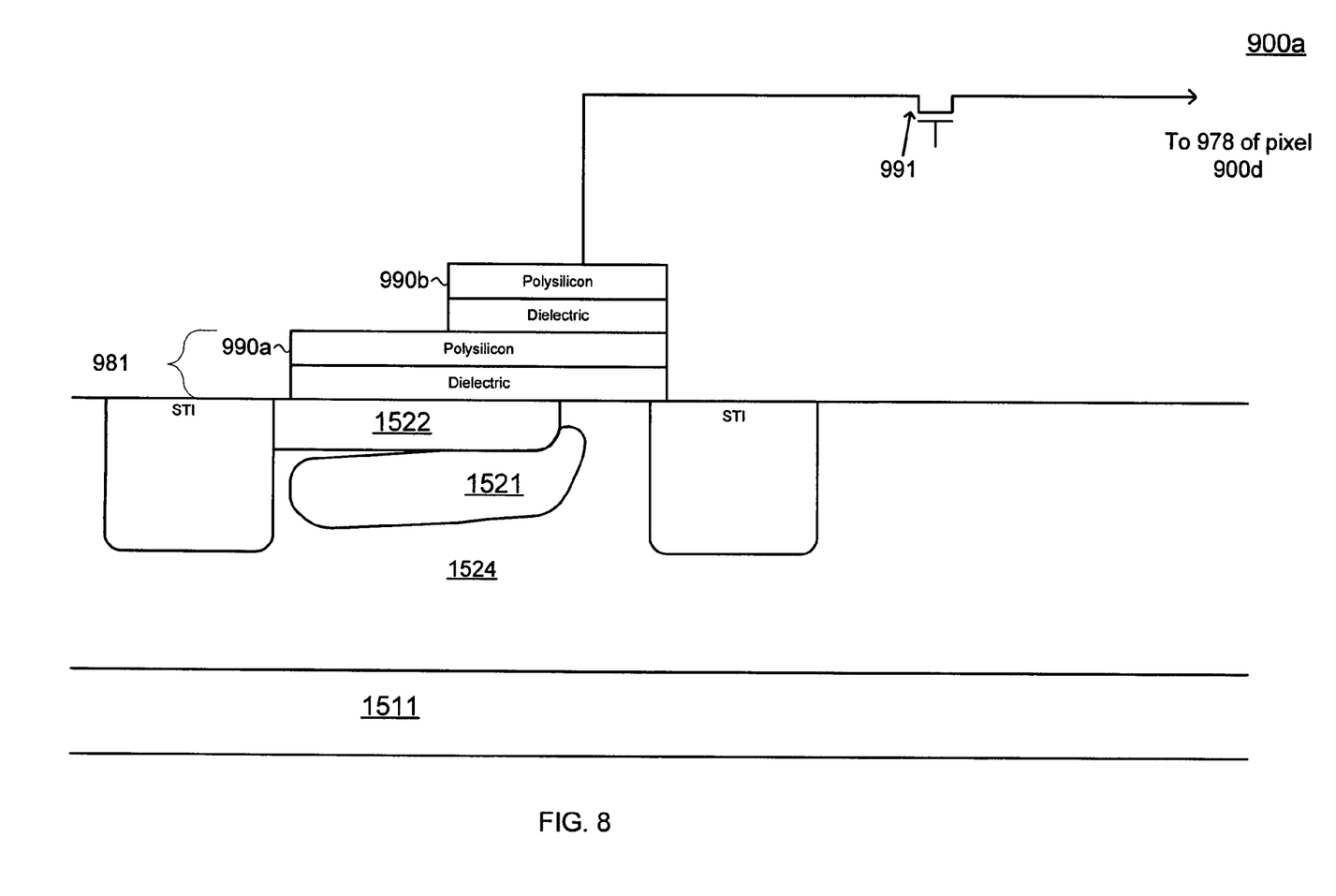
FIG. 8 is a cross-sectional view of a pixel in accordance with an exemplary embodiment of the invention.

FIG. 8 is a cross-sectional view of a portion of FIG. 7 pixel 900*a* along the lines 8-8. The pixel 900*a* includes a capacitor 990 having a lower plate 990*a* formed by a part of the electrode of photogate 981. The upper plate 990*b* of capacitor 990 is electrically connected to a pixel 900*d* in a different row through transistor 991 of pixel 900(*d*). Although FIGS. 7 and 8 show the capacitor 990 over only a portion of the photogate 984 of a pixel to maximize photon to electron conversion by the photogate 981, in some implementations, the capacitor 990 may extend over the entire area of the photogate 981.

As shown in FIGS. 7 and 8, pixel 900*d* includes the photo-conversion device photogate 981, a transfer transistor 961, and reset transistor 684. The photo-conversion device 981 may be formed as a photogate having a p-n-p construction comprising a p-type surface layer 1522 and an n-type accumulation region 1521 within a p-type active EPI layer 1524 provided over a p-type substrate 1511. As best seen in FIG. 7 the photo-conversion device 991 is adjacent to and partially underneath the gate of the transfer transistor 961. The reset transistor 684 is on a side of the transfer transistor 961 opposite the photo-conversion device 991. As shown in FIG. 7, the reset transistor 684 includes a source/drain region 1502 which is connected to a pixel supply voltage Vaa_pix. The floating diffusion region 978 is between the transfer and reset transistors 961, 684 and is contained with a p-well. The floating diffusion region 978 is coupled to the gate of source follower transistor 986 and the output of the source follower transistor 986 is gated by row select transistor 988.

Figure 9:
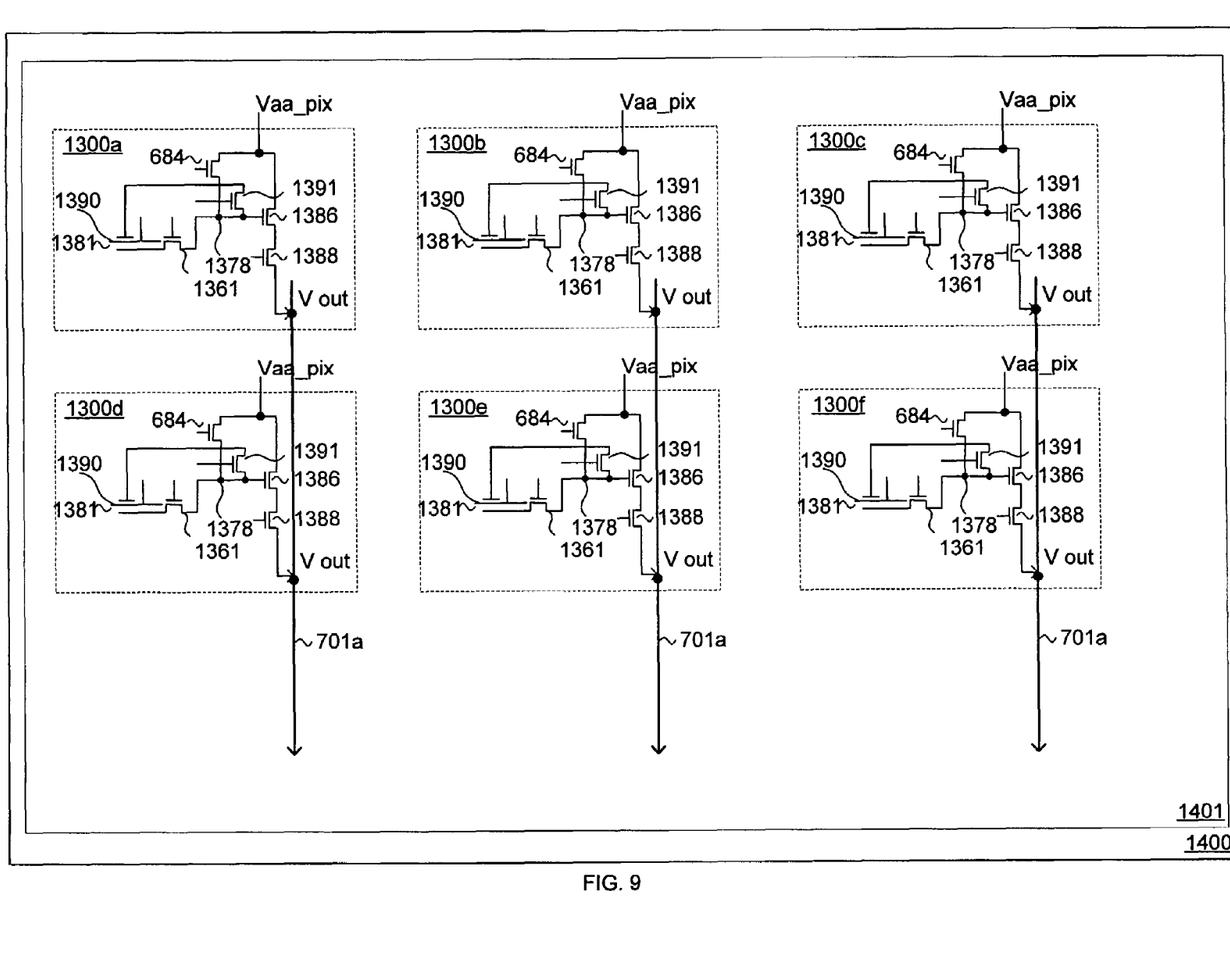
FIG. 9 is a schematic diagram of a pixel array of an imaging device in accordance with an exemplary embodiment of the invention.

FIG. 9 shows an electrical schematic of imaging device 1400, having a pixel array 1401 which includes a plurality of pixels in accordance with an exemplary embodiment of the invention. Pixel circuit 1300*d* is part of pixel array 1401 and is representative of other pixels in the array. The pixel circuit 1300*d* includes photogate 1381, transistor 1391, which may be operated to provide pixel 1300*d* with a dual conversion gain (DCG), a storage node formed as a floating diffusion region 1378, transfer transistor 1361, reset transistor 1384 and readout circuitry which includes source follower transistor 1386 and row select transistor 1388. The electrode of the photogate 1381 also serves as one plate of a capacitor 1390. The other plate of capacitor 1390 is coupled to a floating diffusion region 1378 through transistor 1391. Pixel array 1401 differs from pixel array 1001 in that the pixels, e.g., 1300*a-f,* of pixel array 1401 in each pixel, e.g., 1300*d,* the capacitor 1390 is switchably coupled to the floating diffusion region 1378 of the pixel by transistor 1391.

By capacitor 1390 having one plate shared with the photogate of a pixel, the capacitor 1390 can be easily fabricated over a portion of the photogate 1381. Thereby conserving layout space in the pixel array of 1401. As such, the pixel array 1401 can take advantage of the benefits that accompany the inclusion of pixel capacitors into the pixel array 1401 without significantly affecting the fill factor.

Figure 10:
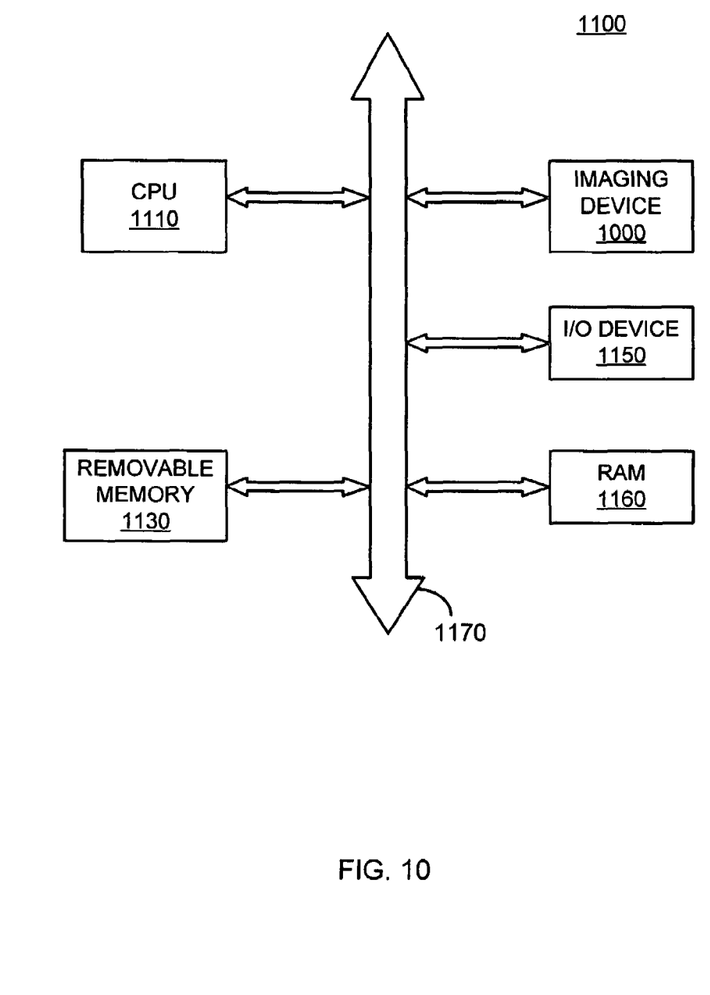
FIG. 10 is a block diagram showing a processor system incorporating at least one imaging device constructed in accordance with an embodiment of the invention

FIG. 10 shows a processor system 1100, which includes an imaging device 1000 which is the same as device 100 (FIG. 1) but employs a pixel array containing pixels and a sample and hold circuit constructed as described above with reference to FIGS. 4 through 8 or FIG. 9. The system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other image acquisition and/or processing systems.

System 1100, for example a camera system, generally comprises a central processing unit (CPU) 1110, such as a microprocessor, that communicates with an input/output (I/O) device 1150 over a bus 1170. Imaging device 1000 also communicates with the CPU 1110 over the bus 1170. The system 1100 also includes random access memory (RAM) 1160, and can include removable memory 1130, such as flash memory, which also communicate with the CPU 1110 over the bus 1170. The imaging device 1000 may be combined with the CPU 1110 with or without memory storage on a single integrated circuit or images device 1000 may be provided on a different chip than the processor.

It should be appreciated that other embodiments of the invention include a method of manufacturing the system 1100. For example, in one exemplary embodiment, a method of manufacturing an CMOS circuit includes the steps of fabricating, over a portion of a substrate corresponding to a single integrated circuit, at least a pixel array with capacitors, each having one plate formed by a portion of the electrodes of the photogates of a pixel which may be a pixel in the row above the current pixel (FIG. 4) as described above using known semiconductor fabrication techniques. In another exemplary embodiment, a method of manufacturing an CMOS circuit includes the steps of fabricating, over a portion of a substrate corresponding to a single integrated circuit, at least a pixel array with capacitors, each having one plate formed by a portion of the electrodes of the photogates of the pixel (FIG. 9) as described above using known semiconductor fabrication techniques. Additionally, the CMOS circuit could have the capacitor formed over the entire electrode of the photogate.

While the invention has been described and illustrated with reference to specific exemplary embodiments, it should be understood that many modifications and substitutions can be made without departing from the spirit and scope of the invention. For example, although the invention is described with respect a capacitor disposed above the photo-conversion region of one pixel and having one plate being coupled to the floating diffusion region of a different pixel in a different row, the invention is not so limited, and the one plate of this capacitor may be coupled to the same floating diffusion region of the pixel or to the floating diffusion region of a pixel elsewhere in the pixel array. Also, the transistor 991 may be omitted and the capacitor non-switchability connected at the one plate to a floating diffusion region. Accordingly, the invention is not to be considered as limited by the foregoing description but is only limited by the scope of the claims.

What is claimed as new and desired to be protected by Letters Patent of the United States is:

1. A pixel array, comprising:
   a pixel having a photo-conversion device employing a first electrode for controlling an operation of said photo-conversion device;
   a capacitor; and
   a floating diffusion node, wherein said floating diffusion node is coupled to one plate of said capacitor which has another plate in common with said first electrode.

2. The pixel array of claim 1, wherein said floating diffusion node is within said pixel.

3. The pixel array of claim 1, also comprising a second pixel, wherein said second pixel includes said floating diffusion node.

4. The pixel array of claim 3, wherein said pixel having a photo-conversion region and said second pixel are in different rows.

5. The pixel array of claim 4, wherein said pixel having a photo-conversion region and said second pixel are in the same column.

6. The pixel array of claim 4, wherein said pixel having a photo-conversion region and said second pixel are in adjacent rows.

7. The pixel array of claim 1, wherein said photo-conversion device is a photogate.

8. The pixel array of claim 7, further comprising a switch coupling said floating diffusion node to said capacitor.

9. The pixel array of claim 8, wherein said switch is a dual conversion gain switch.

10. The pixel array of claim 8, wherein said capacitor is at least partially disposed over said first electrode.

11. The pixel array of claim 8, wherein said capacitor is entirely disposed over said first electrode.

12. A pixel array, comprising:
    a first pixel, comprising:
       a transistor region;
       a photo-conversion region;
       said photo-conversion region having a first electrode;
    a second pixel, comprising:
       a charge storage node; and
       a capacitor having one plate coupled to said storage node and a second plate in common with said first electrode, said first and second pixels being in different rows of the pixel array.

13. The pixel array of claim 12, wherein said first and said second pixel are in adjacent rows of a pixel array.

14. The pixel array of claim 12, wherein said photo-conversion region of said first pixel is a photogate.

15. The pixel array of claim 13, further comprising a switch coupling said storage node and said capacitor.

16. The pixel array of claim 15, wherein said switch is a dual conversion gain switch.

17. The pixel array of claim 12, wherein said capacitor is at least partially disposed over said first electrode.

18. The pixel array of claim 12, wherein said capacitor is entirely disposed over said first electrode.

19. A method of operating a pixel array, comprising:
    integrating a charge in a pixel using a photogate photosensor; and
    storing said integrated charge in a charge storage region, said storage region having a first capacitor plate of a capacitor selectively coupled thereto, a second capacitor plate of said capacitor being in common with an electrode of said photogate.

20. The method of operating a pixel array of claim 19, further comprising the step of:
    selectively disconnecting said first plate of said storage region from said storage region.

21. The method of operating a pixel array of claim 20, further comprising the steps of:
    connecting said charge storage region to a pixel voltage;
    connecting said charge storage region to said one plate of said capacitor; and
    storing a reset signal from said charge storage region.

22. The method of operating a pixel array of claim 21, further comprising the steps of:
    disconnecting said charge storage region from said one plate of said capacitor; and
    disconnecting said charge storage region from said pixel voltage.

23. The method of operatinga pixel array of claim 22, wherein where said pixel having said photogate photosensor also includes said capacitor.

24. The method of operating a pixel array of claim 22, wherein said pixel array also comprises a second pixel, wherein said second pixel includes said capacitor.

25. A method of fabricating a pixel array, comprising:
forming a substrate;
forming a first pixel over said substrate to include a photo-conversion region having a first electrode;
forming a second pixel over said substrate to include a charge storage region;
forming a capacitor having one plate shared with said first electrode; and
forming an electric pathway coupling said capacitor to said charge storage region.

26. The method of fabricating a pixel array of claim 25, wherein said photo-conversion region is a photogate.

27. The method of fabricating a pixel array of claim 25, further comprising the step of:
forming said first pixel in a first pixel row of said pixel array and said second pixel in a second pixel row of said pixel array.

28. The method of fabricating a pixel array of claim 27, wherein said first pixel row is adjacent to said second pixel row.

29. The method of fabricating a pixel array of claim 27, wherein said first pixel and said second pixel are in a same column of said pixel array.

30. The method of fabricating a pixel array of claim 27, further comprising the step of:
forming a switch for selectively coupling said capacitor to said charge storage region.

31. The method of fabricating a pixel array of claim 25, further comprising the step of:
forming said capacitor over at least a portion of said first electrode.

32. The method of fabricating a pixel array of claim 25, further comprising the step of:
forming a capacitor over the entire said first electrode.

33. An integrated circuit, comprising:
a pixel array, comprising:
a pixel having a photo-conversion device employing a first electrode for controlling an operation of said photo-conversion device; and
a capacitor over at least a portion of said first electrode and having a first plate in common with said first electrode and a second plate which can be electrically coupled to a storage node.

34. The integrated circuit of claim 33, wherein said charge storage node is within said pixel.

35. The integrated circuit of claim 33, wherein said pixel array also comprises a second pixel, wherein said second pixel includes said charge storage node.

36. The integrated circuit of claim 35, wherein said pixel having a photo-conversion region and said second pixel are in different rows.

37. The integrated circuit of claim 35, wherein said pixel having a photo-conversion region and said second pixel are in the same column.

38. The integrated circuit of claim 36, wherein said pixel having a photo-conversion region and said second pixel are in adjacent rows.

39. The integrated circuit of claim 33, wherein said photo-conversion device is a photogate.

40. The integrated circuit of claim 33, further comprising a switch coupling said floating diffusion node to said capacitor.

41. The integrated circuit of claim 40, wherein said switch is a dual conversion gain switch.

42. The integrated circuit of claim 33, wherein said capacitor is disposed over the entirety of said first electrode.

43. A processor system, comprising:
a processor; and
an imager coupled to said processor, said imager comprising:
a pixel array, comprising:
a pixel having a photo-conversion device employing a first electrode for controlling an operation of said photo-conversion device;
a capacitor over at least a portion of said first electrode and having a first plate in common with said first electrode and a second plate which can be electrically coupled to a storage node; and a floating diffusion node, wherein said floating diffusion node is coupled to one plate of said capacitor which has another plate in common with said first electrode.

44. The processor system of claim 43, said floating diffusion node is within said pixel.

45. The processor system of claim 43, wherein said pixel array also comprises a second pixel, wherein said second pixel includes said floating diffusion node.

46. The processor system of claim 45, wherein said pixel having a photo-conversion region and said second pixel are in different rows.

47. The processor system of claim 46, wherein said pixel having a photo-conversion region and said second pixel are in the same column.

48. The processor system of claim 46, wherein said pixel having a photo-conversion region and said second pixel are in adjacent rows.

49. The processor system of claim 43, wherein said photo-conversion device is a photogate.

50. The processor system of claim 49, further comprising a switch coupling said floating diffusion node to said capacitor.

51. The processor system of claim 49, wherein said switch is a dual conversion gain switch.

52. The processor system of claim 50, wherein said capacitor is at least partially disposed over said first electrode.

53. The processor system of claim 50, wherein said capacitor is entirely disposed over said first electrode.

54. A pixel array, comprising:
a first pixel in a first row having a first photosensor;
a second pixel in a second row having a second photosensor; and
a floating diffusion provided in one of said first and second pixels for selectively receiving charges from one of said first and second photosensor. wherein during a first time said pixel is configured to receive charges from said first photosensor and during a second time said pixel is configured to receive charges from said second photosensor.

* * * * *